United States Patent
Rao et al.

(10) Patent No.: US 8,828,858 B2
(45) Date of Patent: Sep. 9, 2014

(54) SPACER PROFILE ENGINEERING USING FILMS WITH CONTINUOUSLY INCREASED ETCH RATE FROM INNER TO OUTER SURFACE

(75) Inventors: Xuesong Rao, Singapore (SG); Chim Seng Seet, Singapore (SG); Hai Cong, Singapore (SG); Zheng Zou, Singapore (SG); Alex See, Singapore (SG); Yun Ling Tan, Singapore (SG); Wen Zhan Zhou, Singapore (SG); Lup San Leong, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 216 days.

(21) Appl. No.: 13/353,684

(22) Filed: Jan. 19, 2012

(65) Prior Publication Data

US 2013/0187202 A1  Jul. 25, 2013

(51) Int. Cl.
*H01L 21/3205* (2006.01)
*H01L 21/4763* (2006.01)

(52) U.S. Cl.
USPC .............. 438/585; 257/368; 257/E21.438; 257/E29.255

(58) Field of Classification Search
None
See application file for complete search history.

(56) References Cited

U.S. PATENT DOCUMENTS

| 5,854,105 | A * | 12/1998 | Tseng | 438/253 |
| 7,078,356 | B2 * | 7/2006 | Li et al. | 438/789 |
| 2005/0208755 | A1 * | 9/2005 | Ruelke et al. | 438/622 |
| 2007/0155105 | A1 * | 7/2007 | Seo et al. | 438/283 |

* cited by examiner

*Primary Examiner* — Sonya D McCall Shepard
*(74) Attorney, Agent, or Firm* — Ditthavong & Steiner, P.C.

(57) ABSTRACT

Interlayer dielectric gap fill processes are enhanced by forming gate spacers with a tapered profile. Embodiments include forming a gate electrode on a substrate, depositing a spacer material over the gate electrode and substrate, the spacer layer having a first surface nearest the gate electrode and substrate, a second surface furthest from the gate electrode and substrate, and a continuously increasing etch rate from the first surface to the second surface, and etching the spacer layer to form a spacer on each side of the gate electrode. Embodiments further include forming the spacer layer by depositing a spacer material and continuously decreasing the density of the spacer material during deposition or depositing a carbon-containing spacer material and causing a gradient of carbon content in the spacer layer.

11 Claims, 3 Drawing Sheets

SPACER PROFILE ENGINEERING USING FILMS WITH CONTINUOUSLY INCREASED ETCH RATE FROM INNER TO OUTER SURFACE

TECHNICAL FIELD

The present disclosure relates to methods for forming semiconductor gate spacers having a tapered profile. The present disclosure is particularly applicable to 40 nanometer (nm) technology nodes and beyond.

BACKGROUND

As the dimensions of semiconductor devices continue to shrink, the spacing between adjacent polysilicon gates decreases, the aspect ratio of the gaps between the gates increases, and filling of the gaps with a dielectric material becomes very challenging. As the gaps are actually formed between spacers of adjacent gates, the spacer profile is a key factor in a high-quality gap fill. Conventional spacers generally result in a substantially uniform gap width, leading to voids in the filled dielectric material. Voids in the interlayer dielectric (ILD) may cause shorts between drain contacts or between source contacts, thereby degrading device performance.

Achieving a void-free gap fill of dielectric material is particularly difficult between double-poly gates, for example having a height about 200 nanometers (nm), with tight spacing, e.g. having a minimum spacing of 108 nm, in a typical embedded non-volatile memory (eNVM) process flow. Adverting to FIG. 1A, each gate 101 includes a sidewall spacer 103 having an upper portion 105 and a lower portion 107. The lower portion may be characterized by sidewall angle 109, space 111, and height 113. As illustrated in FIG. 1B, when an ILD 115 is deposited over and between two adjacent gates 101, a void 117 is formed. Current process flows, such as deposition of a low temperature oxide (LTO) 201 to a thickness of 500 angstroms (Å) over gate 203 (as illustrated in FIG. 2A) followed by anisotropic top-down reactive ion etching (RIE), produce a sidewall spacer profile 205 (as illustrated in FIG. 2B) with a top corner rounded off and a large, substantially vertical, lower portion 207, for example having a height of 60 nm to 180 nm. The significant vertical portion is not favored by current ILD gap fill processes, such as a high aspect ratio process (HARP), causing formation of voids 117 during ILD gap fill.

A need therefore exists for methodology enabling formation of gate spacers having a tapered profile, and the resulting device.

SUMMARY

An aspect of the present disclosure is a method of forming a semiconductor device having gate spacers with a tapered profile.

Another aspect of the present disclosure is semiconductor device having tapered gate spacers.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a gate electrode on a substrate; forming a spacer layer over the gate electrode and substrate, the spacer layer having a first surface nearest the gate electrode and substrate and a second surface furthest from the gate electrode and substrate, the spacer layer further having a continuously increasing etch rate from the first surface to the second surface; and etching the spacer layer to form a spacer on each side of the gate electrode.

Aspects of the present disclosure include forming the spacer layer by: depositing a spacer material; and continuously decreasing the density of the spacer material during deposition. Further aspects include depositing the spacer material using ozone ($O_3$) and tetraethyl orthosilicate (TEOS) as precursors, and continuously decreasing the density of the spacer material by continuously decreasing an $O_3$ to TEOS ratio during deposition of the spacer material, for example by continuously increasing the TEOS while maintaining a constant flow of $O_3$. Other aspects include forming the spacer layer by: depositing a spacer material comprising carbon; and causing a gradient of carbon content in the spacer layer. Additional aspects include depositing the spacer material using silane ($SiH_4$) and carbon dioxide ($CO_2$) as precursors, and causing the gradient of carbon content in the spacer layer by causing carbon depletion at the outer surface of the spacer layer, for example by performing an $O_2$ or $O_3$ plasma treatment after deposition of the spacer material.

Another aspect of the present disclosure is a device including a substrate; a gate electrode on the substrate; and a tapered spacer on each side of the gate electrode, the tapered spacer having a continuously increasing etch rate from closest to the gate electrode to furthest from the gate electrode.

Aspects include the tapered spacers each having a decreasing density from closest to the gate electrode to furthest from the gate electrode. Further aspects include the tapered spacers each being formed from ozone ($O_3$) and tetraethyl orthosilicate (TEOS) precursors, with a continuously decreasing $O_3$ to TEOS ratio from closest to the gate electrode to furthest from the gate electrode. Another aspect includes the tapered spacers each having a gradient of carbon content from closest to the gate electrode to furthest from the gate electrode. Additional aspects include the tapered spacers each being formed from silane ($SiH_4$) and carbon dioxide ($CO_2$) precursors; and causing carbon depletion of the spacer furthest from the gate electrode.

Another aspect of the present disclosure is a method including: forming at least two gate electrodes on a substrate; forming a spacer layer over the gate electrodes and substrate, the spacer layer having a first surface nearest the gate electrodes and substrate and a second surface furthest from the gate electrodes and substrate, the spacer layer further having a continuously increasing etch rate from the first surface to the second surface; etching the spacer layer to form a tapered spacer on each side of each gate electrode; and depositing an interlayer dielectric (ILD) on and between the at least two gate electrodes.

Aspects include etching the spacer layer by anisotropic reactive ion etching (RIE). Further aspects include forming the spacer layer by depositing a spacer material using ozone ($O_3$) and tetraethyl orthosilicate (TEOS) as precursors; and continuously increasing the TEOS while maintaining a constant flow of $O_3$ during deposition. Additional aspects include forming the spacer layer by: depositing a nitrogen-free dielectric antireflective coating using silane ($SiH_4$) and carbon dioxide ($CO_2$) as precursors; and performing an $O_2$ or $O_3$ plasma treatment after deposition of the dielectric antireflective coating to cause a decreasing gradient of carbon content from the first surface to the second surface of the spacer layer.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of void formation attendant upon current gap fill processes between adjacent semiconductor gates. In accordance with embodiments of the present disclosure, gate spacers are formed with a tapered profile to minimize the vertical portion therebetween. The resulting gap has a large opening in the upper portion and a narrow gap in the lower portion, thereby reducing void formation during gap filling.

Methodology in accordance with embodiments of the present disclosure includes forming a gate electrode on a substrate, forming a spacer layer over the gate electrode and substrate, the spacer layer having a first surface nearest the gate electrode and substrate, a second surface furthest from the gate electrode and substrate, and a continuously increasing etch rate from the first surface to the second surface, and etching the spacer layer to form a spacer on each side of the gate electrode.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1A:
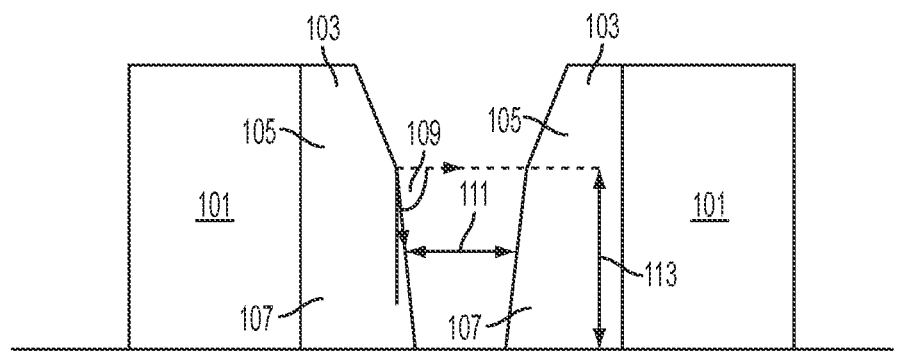
FIGS. 1A and 1B schematically illustrate a model for current ILD gap fill.
Figure 1B:
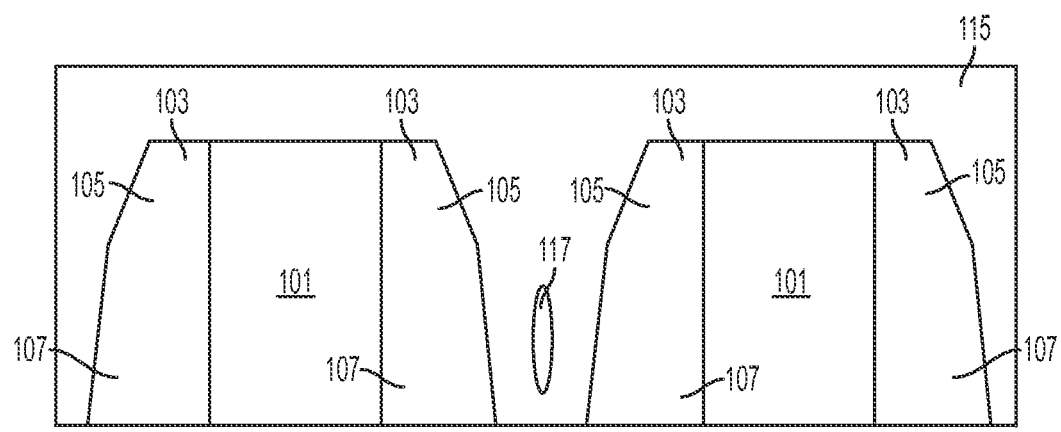
Figure 2A:
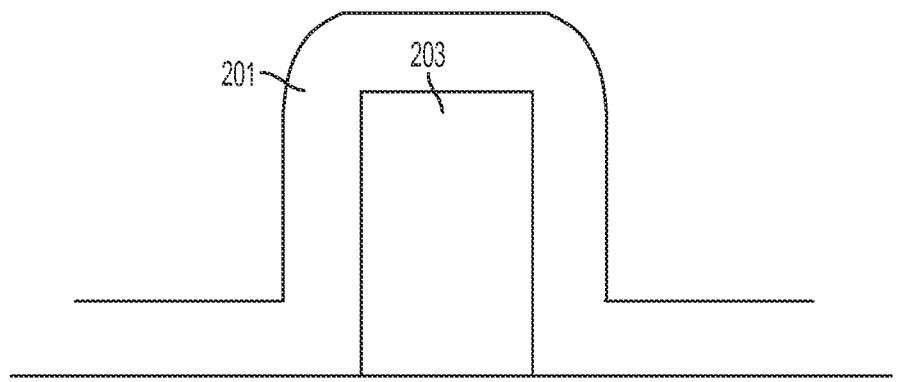
FIGS. 2A and 2B schematically illustrate a current process flow for forming gate spacers.
Figure 2B:
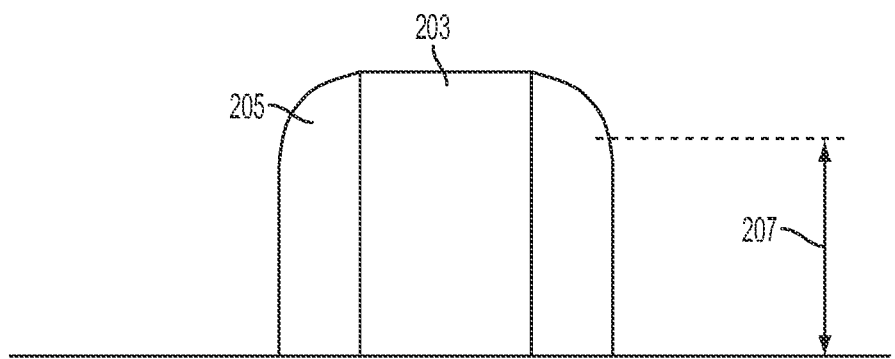
Figure 3:
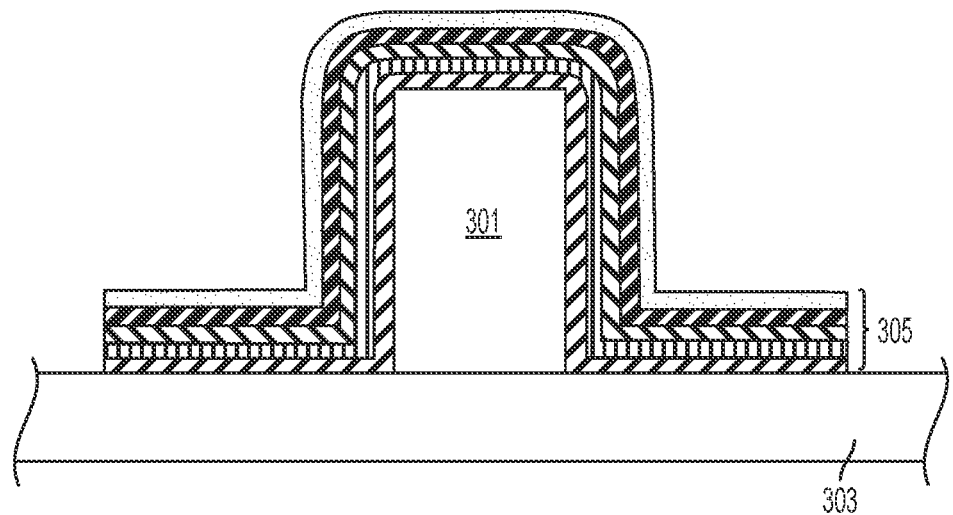
FIGS. 3 and 4 schematically illustrate a process flow for fabricating a semiconductor device having gate spacers with a tapered profile, in accordance with an exemplary embodiment.

Adverting to FIG. 3, after gate 301 is formed on substrate 303, a spacer layer 305, having a continuously increased etch rate from the inner surface, closest to gate 301, to the outer surface, is formed on gate 301. This is the extreme case of a multilayer film with a stepwise increased etch rate from the inner layer to the outer layer.

Spacer layer 305 may be formed of silicon dioxide ($SiO_2$), deposited using a typical ozone ($O_3$) tetraethyl orthosilicate (TEOS) chemical vapor deposition (CVD) process, with $O_3$ and TEOS as precursors and at a processing temperature, for example, between 400° C. and 500° C. However, in contrast to the typical ozone TEOS process, the TEOS is ramped up, for example, from 1.125 g to 2.7 g, while keeping the $O_3$ flow stable. Since the layer properties are sensitive to the ozone/TEOS ratio of the process, a higher ozone/TEOS ratio results in a denser film. Therefore, by ramping up the TEOS during deposition, a layer with a continuously decreasing density from the inner surface to the outer surface may be formed, which in turn translates to an etch rate gradient that continuously increases from the inner surface to the outer surface.

Alternatively, spacer layer 305 may be formed using a typical nitrogen free dielectric antireflective coating (DARC). The DARC may be deposited by plasma enhanced CVD (PECVD), using silane ($SiH_4$) and carbon dioxide ($CO_2$) as precursors. By modifying the $SiH_4$ and $CO_2$ flows, the carbon content may be tuned in a range of 0 to 5%. An $O_2$ or $O_3$ plasma treatment (i.e., igniting plasma in an $O_2$ or $O_3$ environment) may then be applied, causing carbon depletion in the outer part of spacer layer 305, resulting in a gradient of carbon content from the inner surface to the outer surface of the layer. With the proper etch chemistry, the carbon gradient in turn translates into an etch rate gradient across the thickness of the layer.

Figure 4:
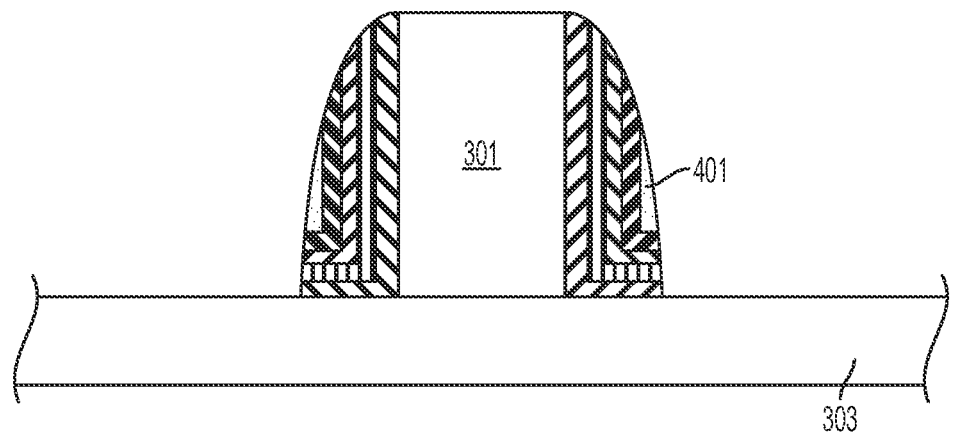

Once spacer layer 305 is deposited and treated to create an etch rate gradient, an anisotropic spacer RIE is performed. Due to the etch rate difference, the outer surface of layer 305 will be etched more than the inner surface, thereby producing a tapered spacer profile, as illustrated in FIG. 4. As a result, spacers 401 have a more tapered profile than conventional spacers 205, making them more favorable for the subsequent ILD gap fill process.

The embodiments of the present disclosure can achieve several technical effects, forming a tapered gate spacer profile, thereby facilitating ILD gap fill and reducing ILD voids. Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated semiconductor devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming a gate electrode on a substrate;
   forming a spacer layer over the gate electrode and substrate having a first surface nearest the gate electrode and substrate and a second surface furthest from the gate electrode and substrate, by depositing a spacer material using ozone ($O_3$) and tetraethyl orthosilicate (TEOS) as precursors and continuously increasing the TEOS while maintaining a constant flow of $O_3$ or by depositing a spacer material comprising carbon and causing a gradient of carbon content in the spacer layer by causing carbon depletion at the second surface of the spacer layer, the continuously increasing TEOS or gradient of carbon content causing a continuously increasing etch rate from the first surface to the second surface; and
   etching the spacer layer to form a tapered spacer on each side of the gate electrode.

2. The method according to claim 1, comprising forming the spacer layer by:
   continuously decreasing the density of the spacer material during deposition.

3. The method according to claim 1, comprising depostiting the spacer material using silane ($SiH_4$) and carbon dioxide ($CO_2$) as a precursor.

4. The method according to claim 1, comprising causing carbon depletion by performing an $O_2$ or $O_3$ plasma treatment after deposition of the spacer material.

5. The method according to claim 2, comprising continuously decreasing the density of the spacer material by continuously decreasing an $O_3$ to TEOS ratio during deposition of the spacer material.

6. The method according to claim 5, comprising continuously decreasing the $O_3$ to TEOS ratio by continuously increasing the TEOS from 1.125 grams (g) to 2.7 g while maintaining a constant flow of $O_3$.

7. The method according to claim 3, further comprising tuning the carbon content in a range of 0-5% by controlling a flow of the $SiH_4$ and the $CO_2$.

8. A method comprising:
   forming at least two gate electrodes on a substrate;
   forming a spacer layer over the gate electrodes and substrate having a first surface nearest the gate electrodes and substrate and a second surface furthest from the gate electrodes and substrate, by depositing a spacer material using ozone ($O_3$) and tetraethyl orthosilicate (TEOS) as precursors and continuously increasing the TEOS while maintaining a constant flow of $O_3$ or by depositing a spacer material comprising carbon and causing a decreasing gradient of carbon content in the spacer layer by causing carbon depletion at the second surface of the spacer layer, the continuously increasing TEOS or decreasing gradient of carbon content causing a continuously increasing etch rate from the first surface to the second surface;
   etching the spacer layer to form a tapered spacer on each side of each gate electrode; and depositing an interlayer dielectric (ILD) on and between the at least two gate electrodes.

9. The method according to claim 8, comprising etching the spacer layer by anisotropic reactive ion etching (RIE).

10. The method according to claim 9, comprising continuously decreasing the $O_3$ to TEOS ratio by continuously increasing the TEOS from 1.125 grams (g) to 2.7 g while maintaining a constant flow of $O_3$.

11. The method according to claim 9, comprising forming the spacer layer by: depositing a nitrogen-free dielectric anti-reflective coating using silane ($SiH_4$) and carbon dioxide ($CO_2$) as precursors; and performing an $O_2$ or $O_3$ plasma treatment after deposition of the dielectric antireflective coating to cause the depletion of carbon content from the first surface to the second surface of the spacer layer.

* * * * *